(12) United States Patent
Zan (10) Patent No.: US 10,641,848 B2
(45) Date of Patent: May 5, 2020

(54) SIGNAL RECEPTION OF MAGNETIC RESONANCE IMAGING DEVICE

(71) Applicant: Shanghai Neusoft Medical Technology Co., Ltd., Shanghai (CN)

(72) Inventor: Guofeng Zan, Shanghai (CN)

(73) Assignee: Shanghai Neusoft Medical Technology Co., Ltd., Shanghai (CN)

( * ) Notice: Subject to any disclaimer, the term of this patent is extended or adjusted under 35 U.S.C. 154(b) by 110 days.

(21) Appl. No.: 15/982,738

(22) Filed: May 17, 2018

(65) Prior Publication Data

US 2018/0335490 A1    Nov. 22, 2018

(30) Foreign Application Priority Data

May 17, 2017 (CN) .......................... 2017 1 0348442

(51) Int. Cl.
  *G01R 33/36* (2006.01)
  *H03G 3/00* (2006.01)
  *G01R 33/54* (2006.01)

(52) U.S. Cl.
  CPC ....... *G01R 33/3621* (2013.01); *G01R 33/543* (2013.01)

(58) Field of Classification Search
  CPC .. H03G 3/00; H03G 3/20; H03G 5/16; H03G 3/001; H03G 2201/50; G01R 33/3621; G01R 33/54; G01R 33/546; G01R 33/543; G01R 33/34; G01R 33/36; G01R 33/56
  See application file for complete search history.

(56) References Cited

U.S. PATENT DOCUMENTS

| 6,400,412 B1 | 6/2002 | Suzuki |
| 2009/0164160 A1 | 6/2009 | Gibson et al. |
| 2013/0163648 A1* | 6/2013 | Kennard ............ H04L 27/2626 375/219 |

FOREIGN PATENT DOCUMENTS

| CN | 1330452 A | 1/2002 |
| CN | 101176673 A | 5/2008 |
| CN | 101257472 A | 9/2008 |
| CN | 101833100 A | 9/2010 |

(Continued)

OTHER PUBLICATIONS

State Intellectual Property Office of the People's Republic of China, Office Action and Search Report Issued in Application No. 201710348442.9, dated Apr. 25, 2019, 14 pages,(Submitted with Machine Translation).

*Primary Examiner* — Son T Le
(74) *Attorney, Agent, or Firm* — Fish & Richardson P.C.

(57) ABSTRACT

Methods, devices, and apparatus for signal reception are provided. In one aspect, a receiver includes: a group delay circuit configured to perform a group delay on an original analog signal to obtain a group delayed analog signal, a controller configured to determine a gain mode according to an amplitude of the original analog signal, a gain circuit coupled to the group delay circuit and the controller and configured to adjust a power of the group delayed analog signal according to the determined gain mode to obtain an adjusted analog signal, an analog-to-digital converter coupled to the gain circuit and configured to perform an analog-to-digital conversion on the adjusted analog signal to generate a digital signal, and an amplitude-phase-processing circuit configured to adjust amplitude and phase of the digital signal according to the determined gain mode.

19 Claims, 5 Drawing Sheets

(56) References Cited

FOREIGN PATENT DOCUMENTS

| | | |
|---|---|---|
| CN | 101896832 A | 11/2010 |
| CN | 102522960 A | 6/2012 |
| CN | 103208998 A | 7/2013 |
| CN | 103795475 A | 5/2014 |
| CN | 104506205 A | 4/2015 |
| CN | 205320042 U | 6/2016 |
| CN | 105959017 A | 9/2016 |
| EP | 1664820 B1 | 10/2008 |
| JP | S5989097 A | 5/1984 |

\* cited by examiner

SIGNAL RECEPTION OF MAGNETIC RESONANCE IMAGING DEVICE

CROSS REFERENCE TO RELATED APPLICATIONS

This application claims priority to Chinese Patent Application No. 201710348442.9, filed on May 17, 2017, the entire content of which is incorporated herein by reference.

BACKGROUND

In a magnetic resonance imaging (MRI) technology, a magnet is used to generate a constant magnetic field, a subject is excited through a radio frequency (RF) system and a gradient system to generate a magnetic resonance signal, the magnetic resonance signal is acquired by a receiver, and an image is reconstructed by an image reconstructing system based on the acquired magnetic resonance signal. Amplitude of the magnetic resonance signal can reach −20 dBm (decibel-milliwatts). In addition, to improve a quality of the reconstructed image, the receiver is desired to receive the magnetic resonance signal with amplitude of −137 dBm. As described above, a dynamic range of the amplitude of the magnetic resonance signal received by the receiver can reach 117 dB (decibel). In an example, when the receiver includes a 16-bit Analog-to-Digital Converter (ADC), the dynamic range of the amplitude of the magnetic resonance signal received by the receiver is 96 dB. In this case, the receiver may not receive the magnetic resonance signal with an amplitude out of the dynamic range 96 dB. Besides the MRI technology, in technologies, such as radar and radio communication, in some cases, the dynamic range of the amplitude of the signal received by the receiver can be also greater than the theoretical dynamic range of the 16-bit ADC.

NEUSOFT MEDICAL SYSTEMS CO., LTD. (NMS), founded in 1998 with its world headquarters in China, is a leading supplier of medical device, medical IT solutions, and healthcare services. NMS supplies medical device with a wide portfolio, including CT, Magnetic Resonance Imaging (MRI), digital X-ray machine, ultrasound, Positron Emission Tomography (PET), Linear Accelerator (LINAC), and biochemistry analyser. Currently, NMS' products are exported to over 60 countries and regions around the globe, serving more than 5,000 renowned customers. NMS's latest successful developments, such as 128 Multi-Slice CT Scanner System, Superconducting MRI, LINAC, and PET products, have led China to become a global high-end medical device producer. As an integrated supplier with extensive experience in large medical device, NMS has been committed to the study of avoiding secondary potential harm caused by excessive X-ray irradiation to the subject during the CT scanning process.

SUMMARY

The present disclosure provides methods, devices and apparatus for signal reception by a receiver, e.g., in a magnetic resonance imaging (MRI) device, by determining a gain mode based on an amplitude of an analog signal before adjusting the analog signal, which can provide sufficient time for switching the gain mode to ensure real-time performance of gain adjustment with relatively low costs and power consumption, thereby increasing a dynamic range of the receiver.

One aspect of the present disclosure features a receiver including: a group delay circuit configured to perform a group delay on an original analog signal to obtain a group delayed analog signal; a controller configured to determine a gain mode according to an amplitude of the original analog signal; a gain circuit coupled to the group delay circuit and the controller and configured to adjust, according to the determined gain mode, a power of the group delayed analog signal to obtain an adjusted analog signal; an analog-to-digital (ADC) converter coupled to the gain circuit and configured to perform an analog-to-digital conversion on the adjusted analog signal to generate a digital signal; and an amplitude-phase-processing circuit coupled to the analog-to-digital converter and configured to adjust amplitude and phase of the digital signal according to the determined gain mode.

In some implementations, the controller includes: a comparing module configured to obtain a result by comparing the amplitude of the original analog signal with a preset reference value; and a gain controller configured to: determine that the gain mode is a low gain mode when the result indicates that the amplitude of the original analog signal is greater than the preset reference value; and determine that the gain mode is a high gain mode when the result indicates that the amplitude of the original analog signal is not greater than the preset reference value.

The controller can further include: a time-sequence control module configured to, according to a sampling clock of the analog-to-digital converter, trigger the gain controller to determine the gain mode based on the result from the comparing module. The time-sequence control module can be further configured to: detect whether the analog-to-digital converter finishes the analog-to-digital conversion; and in response to detecting that the analog-to-digital converter finishes the analog-to-digital conversion, trigger the amplitude-phase-processing circuit to adjust the amplitude and the phase of the digital signal according to the gain mode.

The gain circuit can be configured to switch from a current gain mode to the determined gain mode to amplify or attenuate the power of the group delayed analog signal. The gain circuit can be configured such that an amplifying factor of the group delayed analog signal with a relatively larger amplitude is smaller than that of the group delayed analog signal with a relatively smaller amplitude and an attenuating factor of the group delayed analog signal with a relatively larger amplitude is greater than that of the group delayed analog signal with a relatively smaller amplitude. The gain circuit can include a band-pass filter.

In some implementations, the receiver further includes an amplitude-phase-calibrating circuit configured to determine an amplitude scaling factor and a phase compensation value of the digital signal for the amplitude-phase-processing circuit based on the determined gain mode.

In some examples, the amplitude-phase-calibrating circuit includes: a signal generating circuit configured to: generate a reference signal of which a frequency is same as that of the original analog signal, output the reference signal to the gain circuit under a high gain mode to obtain a first signal, and output the reference signal to the gain circuit under a low gain mode to obtain a second signal; an amplitude-phase-detecting circuit coupled to the gain circuit and configured to: detect a first amplitude scaling factor and a first phase deviation value of the first signal with respect to the reference signal, and detect a second amplitude scaling factor and a second phase deviation value of the second signal with respect to the reference signal; and an amplitude-phase-recording module configured to record the first amplitude scaling factor and the first phase deviation value associated with the high gain mode, and record the second amplitude scaling factor and the second phase deviation value associated with the low gain mode. The amplitude-phase-calibrating circuit can be configured to determine the amplitude scaling factor and the phase compensation value of the digital signal based on the determined gain mode, the first amplitude scaling factor and the first phase deviation value associated with the high gain mode, and the second amplitude scaling factor and the second phase deviation value associated with the low gain mode.

The amplitude-phase-processing circuit can be configured to: adjust the amplitude of the digital signal according to an amplitude scaling factor corresponding to the determined gain mode, and compensate the phase of the digital signal according to a phase compensation value corresponding to the determined gain mode.

The gain mode can include one of a high gain mode and a low gain mode, where an amplifying factor of the low gain mode is smaller than an amplifying factor of the high gain mode, and an attenuating factor of the low gain mode is higher than an attenuating factor of the high gain mode.

The group delay circuit can be configured to perform a group delay on the original analog signal for a delay time, and the delay time can be greater than a sum of a first time for the controller determining the gain mode and a second time for the gain circuit to switch a current gain mode to the determined gain mode.

Another aspect of the present disclosure features a method of receiving a signal, including: performing a group delay on an original analog signal to obtain a group delayed analog signal; determining a gain mode according to an amplitude of the original analog signal; adjusting, according to the determined gain mode, a power of the group delayed analog signal to obtain an adjusted analog signal; performing an analog-to-digital conversion on the adjusted analog signal to generate a digital signal; and adjusting amplitude and phase of the digital signal according to the determined gain mode.

In some implementations, determining the gain mode according to the amplitude of the original analog signal includes: comparing the amplitude of the original analog signal with a preset reference value to obtain a result; and determining the gain mode to be one of a low gain mode and a high gain mode by determining whether the result indicates that the amplitude of the analog signal is greater than the preset reference value or not. Determining the gain mode according to the amplitude of the original analog signal can further include: determining when to determine the gain mode based on a sampling clock corresponding to the analog-to-digital conversion. The method can further include: starting to switch a current gain mode at a start moment of a sampling cycle of the sampling clock.

The method can further include: detecting whether the analog-to-digital conversion is completed; and in response to detecting that the analog-to-digital conversion is completed, starting to adjust the amplitude and the phase of the digital signal according to the determined gain mode.

In some implementations, the method further includes: determining an amplitude scaling factor and a phase compensation value of the digital signal based on the determined gain mode. In some cases, determining the amplitude scaling factor and the phase compensation value of the digital signal includes: generating a reference signal of which a frequency is same as that of the original analog signal; obtaining a first signal by processing the reference signal under a high gain mode; obtaining a second signal by processing the reference signal under a low gain mode; determining a first amplitude scaling factor and a first phase deviation value of the first signal with respect to the reference signal; determining a second amplitude scaling factor and a second phase deviation value of the second signal with respect to the reference signal; determining the amplitude scaling factor based on the determined gain mode, the first amplitude scaling factor under the high gain mode and the second amplitude scaling factor under the low gain mode; and determining the phase compensation value under the respective gain modes based on the determined gain mode, the first phase deviation value under the high gain mode and the second phase deviation value under the low gain mode. An amplifying factor of the low gain mode can be smaller than an amplifying factor of the high gain mode, and an attenuating factor of the low gain mode can be higher than an attenuating factor of the high gain mode.

Adjusting the amplitude and the phase of the digital signal according to the determined gain mode can include: adjusting the amplitude of the digital signal according to an amplitude scaling factor corresponding to the determined gain mode, and compensating the phase of the digital signal according to a phase compensation value corresponding to the determined gain mode. Performing the group delay on the analog signal can include: determining that a delay time is greater than a sum of a first time for determining the gain mode and a second time for switching a current gain mode to the determined gain mode; and performing the group delay on the analog signal for the delay time.

The details of one or more examples of the subject matter described in the present disclosure are set forth in the accompanying drawings and description below. Other features, aspects, and advantages of the subject matter will become apparent from the description, the drawings, and the claims. Features of the present disclosure are illustrated by way of example and not limited in the following figures, in which like numerals indicate like elements.

DETAILED DESCRIPTION

Figure 8:
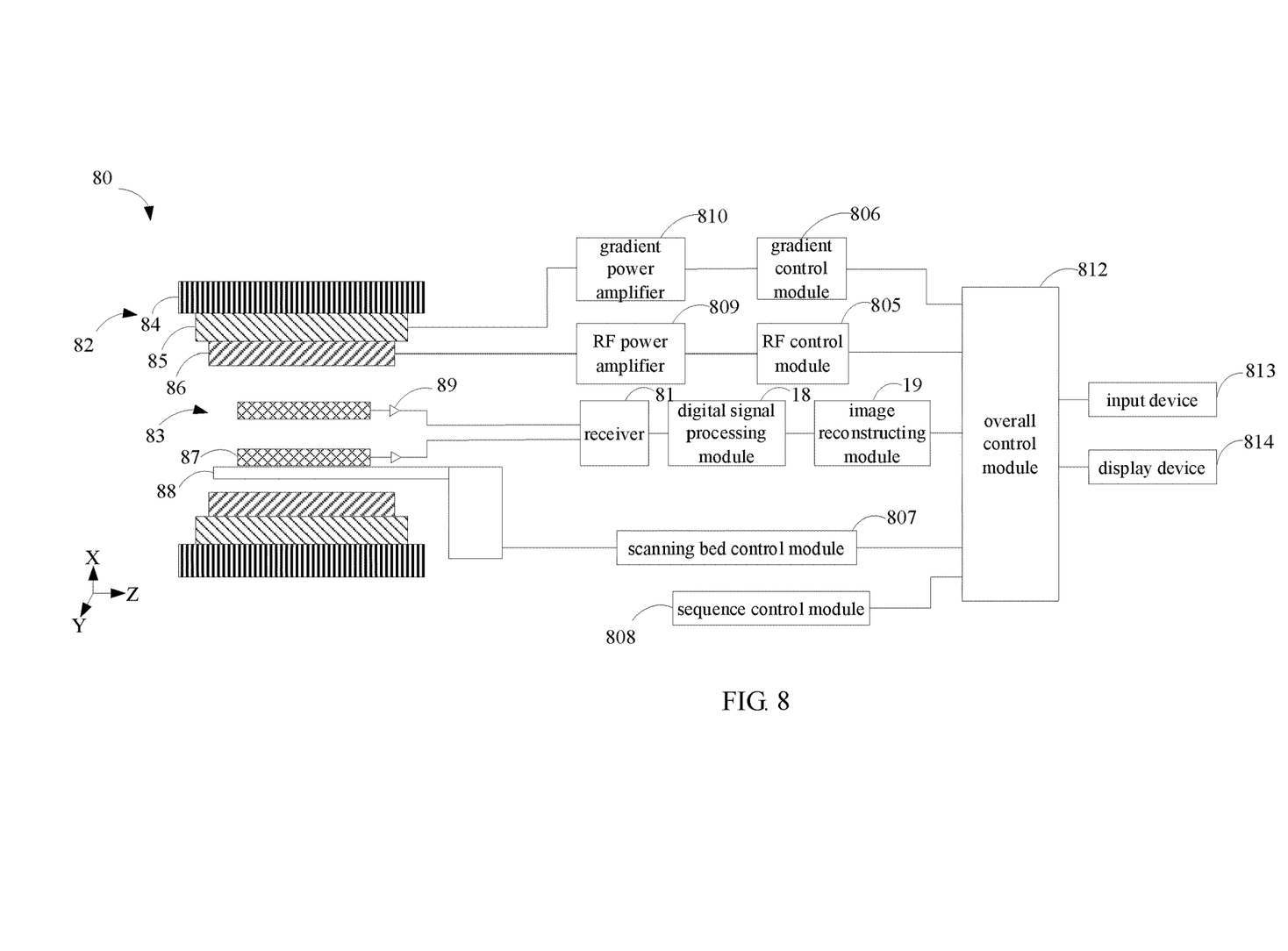
FIG. 8 is a structural diagram illustrating an MRI device according to an example of the present disclosure.

FIG. 8 is a structural diagram illustrating an MRI device 80 according to an example of the present disclosure. The MRI device 80 may include a magnet assembly 82. The magnet assembly 82 may include a cavity 83 for accommodating a subject lying on a scanning bed 88. The magnet assembly 82 may include a main magnet 84 for generating a static magnetic field, a gradient coil 85 for generating gradient magnetic fields in X direction, Y direction, and Z direction, and a RF transmitting coil 86 for emitting RF pulses. The main magnet 84 may use a superconducting coil to generate the static magnetic field. The main magnet 84 may also use a permanent magnet or a resistive magnet. When the main magnet 84 uses the superconducting coil to generate the static magnetic field, the main magnet 84 may include a cooling system for cooling the superconducting coil, such as a cryostat cooled by liquid helium.

The MRI device 80 may also include a signal receiving circuit. As shown in FIG. 8, the signal receiving circuit may include a receiving coil 87 and an amplifier 89. The receiving coil 87 may be configured to receive an echo signal. The echo signal may be an analog signal, such as a RF pulse signal. The echo signal may be amplified by the amplifier 89 to generate an amplified echo signal. In an example, the amplifier 89 is integrated in the receiving coil 87.

The amplified echo signal may be sent to a receiver 81. The receiver 81 may be configured to process the amplified echo signal to generate a digital signal. The digital signal may be adjusted by an amplitude-phase-processing circuit in the receiver 81 to obtain an adjusted digital signal. The adjusted digital signal may be sent to a digital signal processing module 18.

The digital signal processing module 18 may be configured to extract a baseband signal from the adjusted digital signal and send the baseband signal to an image reconstructing module 19. The image reconstructing module 19 may be configured to reconstruct a magnetic resonance image based on the baseband signal. As shown in FIG. 8, the digital signal processing module 18 is independent of (or external to) the receiver 81. In another example, the digital signal processing module 18 is integrated in the receiver 81.

The MRI device 80 further includes a RF control module 805, a gradient control module 806, a scanning bed control module 807 and a sequence control module 808. The RF control module 805 is configured to control the RF transmitting coil 86 through a RF power amplifier 809 to emit RF pulses. In an example, the RF control module 805 is configured to emit a pulse signal to the RF power amplifier 809 in response to the instruction of an overall control module 812. The RF power amplifier 809 is configured to amplify a power of the pulse signal to obtain an amplified pulse signal and then send the amplified pulse signal to the RF transmitting coil 86 for transmitting RF pulses.

The gradient control module 806 is configured to control the gradient coil 85 by the gradient power amplifier 810, so that a plurality of gradient magnetic fields (such as, a gradient magnetic field in the X direction, a gradient magnetic field in the Y direction, and a gradient magnetic field in the Z direction) can be superimposed on the static magnetic field. The gradient magnetic fields may be used to spatially encode nuclear spins within a subject. In an example, the gradient coil 85 includes three separate gradient coils in three orthogonal spatial directions (such as X direction, Y direction, and Z direction) to spatially encode nuclear spins. The gradient control module 806 is configured to control the gradient coil 85 in response to the instruction of the overall control module 812.

The scanning bed control module 807 is used to control the movement of the scanning bed 88. The sequence control module 808 is used to generate a sequence of a gradient pulse and a RF pulse. The overall control module 812 may also be used to control the scanning bed control module 807 and the sequence control module 808. The overall control module 812 may be used to receive information provided by an input device 813 such as a keyboard, a mouse, a touch screen, and the like. A display device 814 may be used to display a reconstructed image, measured data, parameters, waveforms, and the like.

The overall control module 812, the digital signal processing module 18, the image reconstructing module 19, the RF control module 805, the gradient control module 806, the scanning bed control module 807, and the sequence control module 808 of the MRI device 80 may be implemented by software, hardware or a combination of software and hardware. The MRI device 80 may also include other elements not shown, such as memory.

The device described above are only schematic, in which the modules described as separate components may or may not be physically separated, and the components displayed as modules may or may not be physical modules, that is, may be located a place, or it can also be distributed to multiple network modules. According to actual application, some or all of the components may be selected to implement the purpose of the technical solution of the present application.

To expand a dynamic range of an amplitude of a signal received by a receiver (referred to as the dynamic range of the receiver, hereinafter), in an example, an ADC with a relatively large number of bits or a relatively large sampling frequency may be used, for example, an ADC with a relatively large theoretical dynamic range is used. However, it may cause that costs and power consumption of the receiver are increased. The receiver may include an amplifier and an ADC coupled with the amplifier.

In another example, a gain of the amplifier in the receiver is adjusted, so that the dynamic range of the receiver is greater than the theoretical dynamic range of the 16-bit ADC. In an example, the signal received by the receiver is processed through a plurality of amplifiers with different gains, and each of the plurality of amplifiers is provided with an ADC to sample. In this way, an amplifier to be used may be selected according to the amplitude of the received signal. But the use of the plurality of ADCs may cause increased costs and power consumption of the receiver. In another example, the gain of the amplifier is set by pre-calculating the amplitude of the received signal, so as to adjust the dynamic range of the receiver. But the real-time performance of this method is relatively poor. The gain of the amplifier may not be adjusted instantaneously based on the amplitude of the currently received signal.

In view of this, the present disclosure provides a receiver to ensure relatively low costs and power consumption, and the real-time performance of gain adjustment. The receiver may be applied in, but not limited to, the MRI device as shown in FIG. 8.

Figure 1:
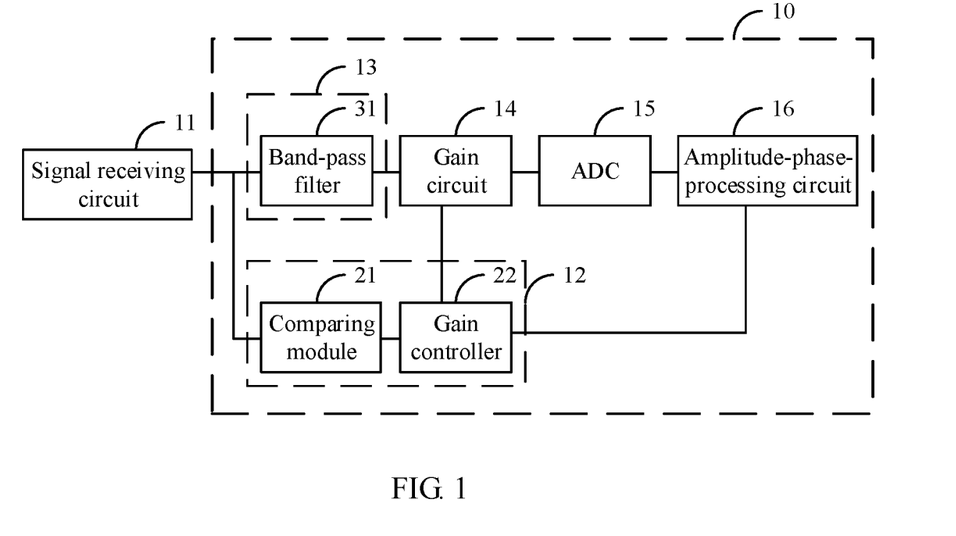
FIG. 1 is a block diagram illustrating a receiver according to an example of the present disclosure.

FIG. 1 is a block diagram illustrating a receiver 10 according to an example of the present disclosure. The receiver 10 is coupled with a signal receiving circuit 11. The signal receiving circuit 11 may be configured to receive an analog signal and output the analog signal to the receiver 10. In an example, the signal receiving circuit 11 includes a receiving coil (not shown in FIG. 1) and an amplifier (not shown in FIG. 1). The amplifier may be integrated in the receiving coil. In an example, the signal receiving circuit 11 includes other circuits, such as antenna or radar. The analog signal received by the signal receiving circuit 11 may be a pulse signal or a continuous analog signal.

As shown in FIG. 1, the receiver 10 includes: a group delay circuit 13 coupled with the signal receiving circuit 11, a gain circuit 14 coupled with the group delay circuit 13, an ADC 15 coupled with the gain circuit 14, a controller 12 coupled with the signal receiving circuit 11 and the gain circuit 14 respectively, and an amplitude-phase-processing circuit 16 coupled with the ADC 15 and the controller 12 respectively.

The group delay circuit 13 may be configured to perform a group delay on the analog signal from the signal receiving circuit 11 to obtain a group delayed analog signal, and output the group delayed analog signal to the gain circuit 14. It is noted that, compared with the analog signal from the signal receiving circuit 11, amplitude of the group delayed analog signal is substantially the same as that of the analog signal, but the group delayed analog signal is delayed in a time domain as a whole.

In an example, the group delay circuit 13 includes a band-pass filter 31 as shown in FIG. 1. The band-pass filter 31 may be configured to perform the group delay on the analog signal and at the same time perform a band-pass filtering on the analog signal. In another example, the group delay circuit 13 may include discrete components such as a capacitor, an inductor, and the like. In other examples, the group delay circuit 13 may also include other circuits capable of implementing the group delay, including discrete components and integrated circuits.

The gain circuit 14 may be configured to adjust, e.g., amplify or attenuate, power of the group delayed analog signal when receiving the group delayed analog signal from the group delay circuit 13, so as to reduce a dynamic range of amplitude of the analog signal from the signal receiving circuit 11. The gain circuit 14 may operate in a high gain mode or a low gain mode, and be configured to adjust the amplitude of the group delayed analog signal under respective gain modes, so as to reduce the dynamic range of the amplitude of the analog signal.

The controller 12 may be configured to determine a gain mode (for example, the gain mode of the gain circuit 14) based on the amplitude of the analog signal from the signal receiving circuit 11. Gain modes include a low gain mode and a high gain mode. When the controller 12 determines the gain mode, a current gain mode in the gain circuit 14 may be switched to the gain mode determined by the controller 12 to adjust, such as amplify or attenuate power of the group delayed analog signal. In this way, an adjusted analog signal may be generated. It is noted that when the gain circuit 14 amplifies the power of the group delayed analog signal, an amplifying factor of the low gain mode may be less than an amplifying factor of the high gain mode; and when the gain circuit 14 attenuates the power of the group delayed analog signal, an attenuating factor of the low gain mode may be greater than an attenuating factor of the high gain mode. It means that the amplifying factor of the group delayed analog signal with a relatively large amplitude is smaller than that of the group delayed analog signal with a relatively small amplitude; and the attenuating factor of the group delayed analog signal with the relatively large amplitude is greater than that of the group delayed analog signal with the relatively small amplitude. In this way, the amplitude range of the group delayed analog signal can be narrowed. In an example, for ease of processing, the amplifying factor of the low gain mode may be set to zero, or the attenuating factor of the high gain mode may be set to zero. It means that only the group delayed analog signal with the relatively small amplitude is amplified, or only the group delayed analog signal the relatively large amplitude is attenuated. In another example, the low-gain mode is used to attenuate the power of the group delayed analog signal with a relatively large amplitude, and the high-gain mode is used to amplify the power of the group delayed analog signal with a relatively small amplitude. The amplifying factors and the attenuating factors of the low gain mode and the high gain mode may be set by those skilled in the art according to the actual application, which are not limited in this application.

In an example, the controller 12 includes a comparing module 21 coupled with the signal receiving circuit 11 and a gain controller 22 coupled with the comparing module 21 and the amplitude-phase-processing circuit 16 respectively. The comparing module 21 may be configured to obtain a result by comparing the amplitude of the analog signal with a preset reference value. The preset reference value may be set according to a principle that an amplitude of an analog signal is within the range of the ADC 15. For example, the preset reference value can be set according to a maximum amplitude of an analog signal received by the receiver 10 and respective gain modes of the gain circuit 14. When the maximum amplitude of an analog signal received by the receiver 10 is 0 dBm, if the high gain mode indicates that an amplitude of a signal received by the gain circuit 14 is added 24 dB under the high gain mode, the low gain mode indicates that an amplitude of a signal received by the gain circuit 14 is added 6 dB under the low gain mode, the preset reference value may be set as −20 dBm. The gain controller 22 may be configured to determine the gain mode according to the result from the comparing module 21.

In an example, the comparing module 21 includes a detector and a comparator, or only includes a comparator. The detector may include an integrated fast RF detection chip, or include discrete components such as diodes and capacitor. The detector may be configured to detect a voltage amplitude of the analog signal and output the detected voltage amplitude to the comparator. The comparator may be configured to compare the voltage amplitude (such as, the amplitude of the analog signal) from the detector with a voltage reference value (such as, the preset reference value) to obtain a result, and output the result to the gain controller 22.

When a first result indicating that the amplitude of the analog signal is greater than the reference value is determined, the comparing module 21 may be configured to output the first result to the gain controller 22. When a second result indicating that the amplitude of the analog signal is not greater than the reference value is determined, the comparing module 21 may be configured to output the second result to the gain controller 22. When the amplitude of the analog signal is greater than the reference value, the gain controller 22 may be configured to determine that the gain mode is the low gain mode. When the amplitude of the analog signal is not greater than the reference value, the gain controller 22 may be configured to determine that the gain mode is the high gain mode.

In some cases, the comparing module 21 may be configured to output a high level signal when the first result is determined, and output a low level signal when the second result is determined. When the gain controller 22 receives the high level signal from the comparing module 21, it is determined that the gain mode is the low gain mode. When the gain controller 22 receives the low level signal from the comparing module 21, it is determined that the gain mode is the high gain mode. Or, the comparing module 21 may be configured to output a low level signal when the first result is determined, and output a high level signal when the second result is determined.

In an example, the group delay circuit 13 is configured to perform the group delay on the analog signal for a delay time. When the delay time is equal to a time for completing the switching of the gain mode (referred to as a switching completion time, hereinafter), it can be ensured that at any time, the gain mode corresponds to the amplitude of the group delayed analog signal received by the gain circuit 14. The switching completion time is equal to a sum of a first time for the controller 12 determining the gain mode (referred to as a gain mode determining time, hereinafter) and a second time for the gain circuit 14 to switch a current gain mode to the determined gain mode (referred to as a gain mode switching time, hereinafter). However, in the actual application, the delay time may be greater than the switching completion time. For example, the delay time is 10 times as the switching completion time. In this way, the switching of the gain mode may be completed in advance to avoid signal overflow. When the gain circuit 14 receives a group delayed analog signal with a relatively large amplitude, if the current gain mode is the high gain mode and is not switched to the low gain mode, the signal overflow can occur. Since a time difference between the delay time and the switching completion time is much smaller than a relatively large amplitude or relatively small amplitude duration of the analog signal, and in some cases, the time difference and the relatively large amplitude or relatively small amplitude duration of the analog signal are not in the same order of magnitude, an error generated during this time difference can be negligible.

The ADC 15 may include a 16-bit ADC, or other-bit ADC. The gain circuit 14 is configured to adjust power of the group delayed analog signal to generate an adjusted analog signal. When the ADC 15 receives the adjusted analog signal, it is configured to perform an analog-to-digital conversion on the adjusted analog signal to generate a digital signal and output the digital signal to the amplitude-phase-processing circuit 16.

When the digital signal is received, the amplitude-phase-processing circuit 16 is configured to adjust amplitude and phase of the digital signal based on the gain mode, so as to eliminate a consequence which is caused by a change of the amplitude and phase of the group delayed analog signal when the group delayed analog signal is adjusted by the gain circuit 14.

In an example, the amplitude-phase-processing circuit 16 is configured to adjust the amplitude and the phase of the digital signal. In an example, the amplitude-phase-processing circuit 16 includes a digital multiplier configured to adjust the amplitude of the digital signal and a digital linear interpolation filter configured to adjust the phase of the digital signal. In a case, when the determined gain mode is the high gain mode, the amplitude-phase-processing circuit 16 is configured to adjust the amplitude of the digital signal according to an amplitude scaling factor corresponding to the high gain mode, and compensate the phase of the digital signal according to a phase compensation value corresponding to the high gain mode. In another case, when the determined gain mode is the low gain mode, the amplitude-phase-processing circuit 16 is configured to adjust the amplitude of the digital signal according to an amplitude scaling factor corresponding to the low gain mode, and compensate the phase of the digital signal according to a phase compensation value corresponding to the low gain mode. It is noted that the amplitude-phase-processing circuit 16 may be included in the controller 12.

As can be seen from the above examples, in the receiver 10, the characteristic of the group delay is used. Before the analog signal enters the gain circuit 14, the controller 12 is configured to determine the gain mode based on the amplitude of the analog signal. In this way, the gain mode can be adjusted in real time according to the amplitude of the analog signal, and sufficient time can be provided for switching the gain mode, so that the real-time performance of gain adjustment can be ensured. Therefore, the receiver 10 provided by the present application can still ensure the real-time performance of gain adjustment when costs and power consumption are relatively low, thereby increasing the dynamic range of the receiver 10.

Figure 2:
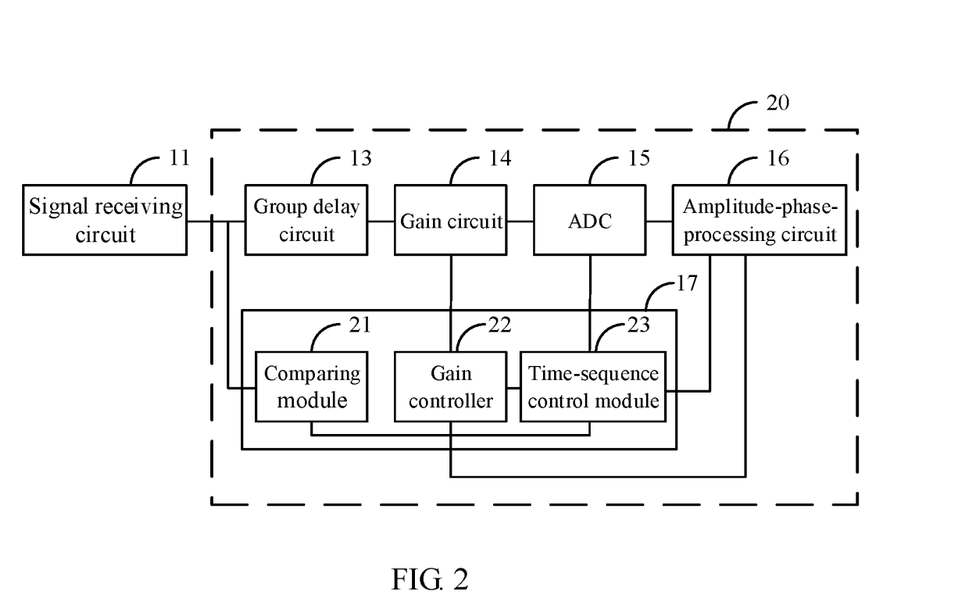
FIG. 2 is a block diagram illustrating a receiver according to another example of the present disclosure.

FIG. 2 is a block diagram illustrating a receiver 20 according to another example of the present disclosure. The receiver 20 is coupled with a signal receiving circuit 11. Similar to the receiver 10 as shown in FIG. 1, the receiver 20 as shown in FIG. 2 also includes the group delay circuit 13, the gain circuit 14, the ADC 15, the amplitude-phase-processing circuit 16 and a controller 17. The function of the respective components in the receiver 20 is similar to that of the corresponding component in the receiver 10 as shown in FIG. 1. Compared with the receiver 10 as shown in FIG. 1, in the receiver 20 as shown in FIG. 2, a distinguishing feature is that the controller 17 further includes a time-sequence control module 23 besides the comparing module 21 and the gain controller 22. The connection relationship of the respective components in the receiver 20 is shown in FIG. 2, where the ADC 15, the comparing module 21, and the gain controller 22 can be connected to the time-sequence control module 23, respectively and independently, and the time-sequence control module 23 can be connected to the amplitude-phase-processing circuit 16.

In an example, the comparing module 21 is configured to obtain a result by comparing the amplitude of the analog signal with the reference value. The time-sequence control module 23 is configured to trigger according to a sampling clock of the ADC 15 that the gain controller 22 determines the gain mode based on the result from the comparing module 21.

In an example, when a first result indicating that the amplitude of the analog signal is greater than the reference value is determined, the comparing module 21 is configured to output the first result to the time-sequence control module 23; and when a second result indicating that the amplitude of the analog signal is not greater than the reference value is determined, the comparing module 21 may be configured to output the second result to the time-sequence control module 23. When the first result from the comparing module 21 is received, the time-sequence control module 23 may be configured to trigger that the gain controller 22 determines the gain mode is the low gain mode based on the sampling clock of the ADC 15. When the second result from the comparing module 21 is received, the time-sequence control module 23 may be configured to trigger that the gain controller 22 determines the gain mode is the high gain mode based on the sampling clock of the ADC 15.

The time-sequence control module 23 may be configured to trigger according to the sampling clock of the ADC 15 that the gain controller 22 determines the gain mode, so that a moment at which a current gain mode starts to be switched coincides with a start moment of a sampling cycle of the ADC 15. In this way, if the gain mode switching time is smaller than the sampling cycle of the ADC 15, it may be avoided that a distorted analog signal during the switching of the gain mode is sampled by the ADC 15. During the switching of the gain mode, a waveform of the group delayed analog signal may be fluctuated, and thus, by the above manner, it is avoided that the distorted analog signal is sampled by the ADC 15 to some extent.

Based on the above examples, the time-sequence control module 23 may be configured to detect whether the ADC 15 finishes the analog-to-digital conversion, and when the analog-to-digital conversion is completed, the time-sequence control module 23 may be configured to trigger the amplitude-phase-processing circuit 16 to adjust the amplitude and the phase of the digital signal based on the gain mode. In this way, it is ensured that an amplitude scaling factor of the amplitude and a phase compensation value which are used by the amplitude-phase-processing circuit 16 correspond to the gain mode, thereby avoiding signal distortion caused by a wrong amplitude scaling factor and a wrong phase compensation value.

Figure 3:
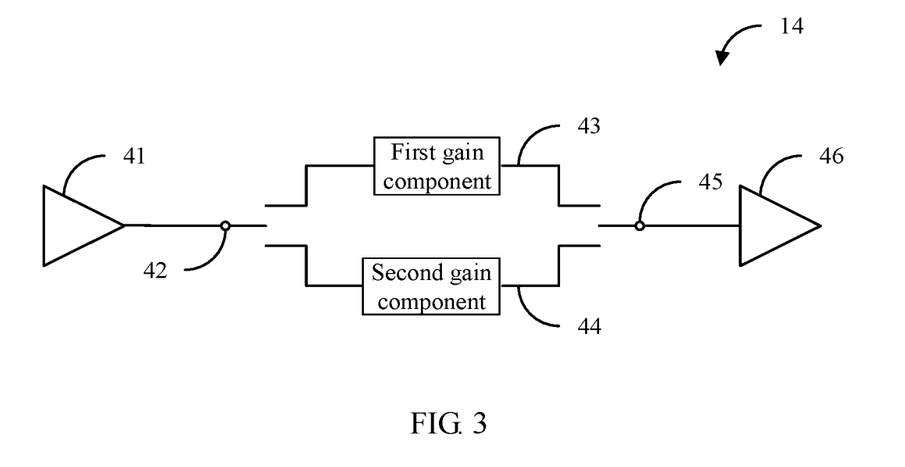
FIG. 3 is a structural diagram illustrating a gain circuit according to an example of the present disclosure.

FIG. 3 is a structural diagram illustrating a gain circuit according to an example of the present disclosure. As shown in FIG. 3, the gain circuit 14 includes amplifiers 41, 46, switches 42, 45, a first gain component 43 and a second gain component 44. The amplifiers 41 and 46 may include isolation amplifiers. The switches 42 and 45 may each include a RF switch with a fast switching speed. The first gain component 43 and the second gain component 44 may each include a π-type resistor attenuation network. At this case, the attenuating factor of the first gain component 43 may be smaller than that of the second gain component 44. It means that the first gain component 43 is a high gain component, and the second gain component 44 is a low gain component. The gain controller 22 is configured to control the switches 42 and 45 to be coupled with the first gain component 43 or the second gain component 44, thereby determining the gain mode. For example, an input signal is processed through the first gain component 43 in the high gain mode, and an input signal is processed through the second gain component 44 in the low gain mode. Due to the isolation characteristics of the isolation amplifiers, the use of such a gain circuit can reduce the influence on the waveform of the group delayed analog signal. That is, the distortion of the amplitude and phase of the group delayed analog signal processed by the gain circuit 14 is relatively small, and the subsequent processing of the amplitude-phase-processing circuit 16 is also facilitated. The amplitude-phase-processing circuit 16 is configured to adjust the amplitude and the phase of the digital signal. In some cases, the gain circuit may further include three or more gain components, a structure of the gain circuit including three or more gain components is similar to the structure of the gain circuit including two gain components, and further detail is omitted for brevity.

It is noted that the comparing module 21 may include a plurality of comparators, which are configured to divide the received analog signal into a plurality of size levels according to the amplitude of the received analog signal, digitally control an attenuation network with an integrated chip, and perform different gain mode processing of the analog signal with different size levels. In this way, different gain modes can be switched. Correspondingly, in the subsequent processing, the amplitude and the phase of the digital signal may be adjusted based on the plurality of size levels.

Figure 4:
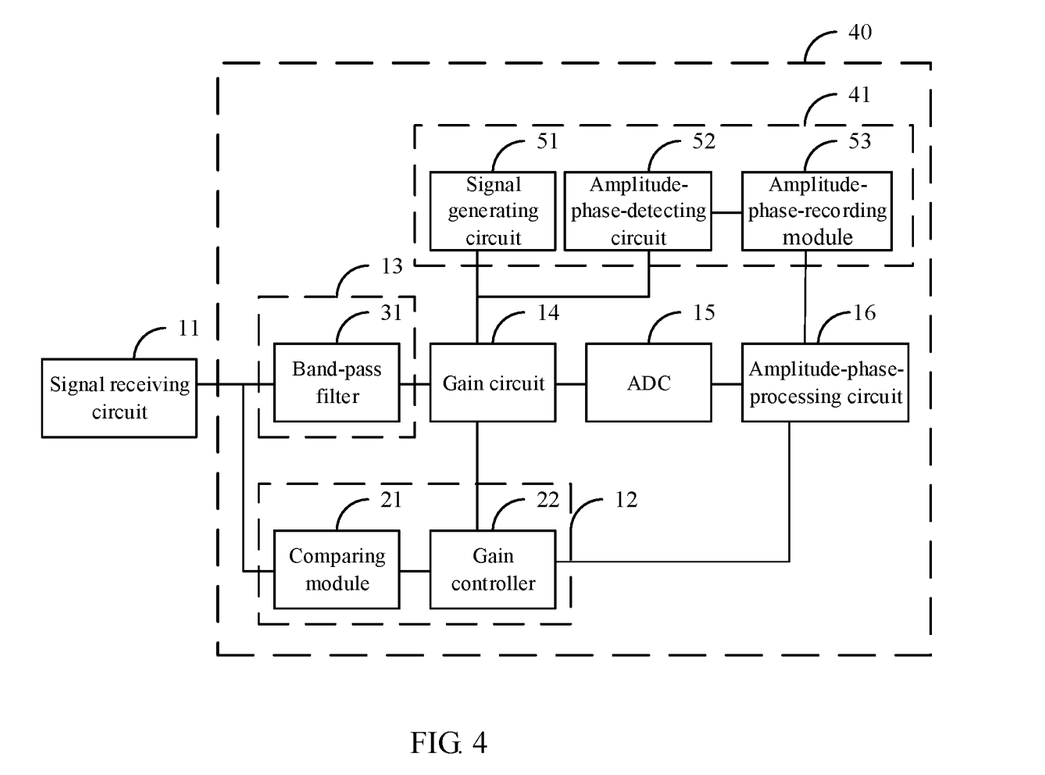
FIG. 4 is a block diagram illustrating a receiver according to still another example of the present disclosure.

FIG. 4 is a block diagram illustrating a receiver 40 according to still another example of the present disclosure. The receiver 40 is coupled with a signal receiving circuit 11. Similar to the receiver 10 as shown in FIG. 1, the receiver 40 as shown in FIG. 4 also includes the group delay circuit 13, the gain circuit 14, the ADC 15, the amplitude-phase-processing circuit 16 and the controller 12. The function of the respective components in the receiver 40 is similar to that of the corresponding component in the receiver 10 as shown in FIG. 1. Compared with the receiver 10 as shown in FIG. 1, a distinguishing feature is that the receiver 40 as shown in FIG. 4 further includes an amplitude-phase-calibrating circuit 41, which is configured to pre-determine an amplitude scaling factor and a phase compensation value of the digital signal under respective gain modes. It is noted that the amplitude scaling factor includes an amplifying factor or an attenuating factor. As shown in FIG. 4, the amplitude-phase-calibrating circuit 41 can include a signal generating circuit 51, an amplitude-phase-detecting circuit 52 and an amplitude-phase-recording module 53. The amplitude-phase-calibrating circuit 41 may cooperate with the gain circuit 14 to determine the amplitude scaling factor and the phase compensation value of the digital signal under respective gain modes. As shown in FIG. 4, the amplitude-phase-calibrating circuit 41 may be integrated in the receiver 40. In an example, the amplitude-phase-calibrating circuit 41 is independent of the receiver 40. When the amplitude-phase-calibrating circuit 41 has determined the amplitude scaling factor and the phase compensation value of the digital signal under respective gain modes, it may not participate in other processing of the receiver 40 for the analog signal received by the signal receiving circuit 11. The connection relationship of the respective components in the receiver 40 is shown in FIG. 4.

The signal generating circuit 51 may be configured to generate a reference signal of which a frequency is the same as that of the analog signal, and output the reference signal to the gain circuit 14. The reference signal may be processed by passing through the high gain mode provided by the gain circuit 14 to obtain a first signal. The reference signal may be processed by passing through the low gain mode provided by the gain circuit 14 to obtain a second signal. The amplitude-phase-detecting circuit 52 may be configured to detect a first amplitude scaling factor and a first phase deviation value of the first signal, and detect a second amplitude scaling factor and a second phase deviation value of the second signal. The amplitude-phase-recording module 53 may be configured to record the first amplitude scaling factor and the first phase deviation value associated with the high gain mode, and the second amplitude scaling factor and the second phase deviation value associated with the low gain mode. Then the amplitude-phase-calibrating circuit 41 may be configured to determine the amplitude scaling factor and the phase compensation value of the digital signal based on the determined gain mode for the digital signal, the first amplitude scaling factor and the first phase deviation value obtained under the high gain mode, and the second amplitude scaling factor and the second phase deviation value obtained under the low gain mode. In this way, compared with the analog signal received by the receiver 11, a digital signal through the high gain mode and a digital signal through the low gain mode can have a same amplitude scaling factor and a same phase deviation. Therefore, it is avoided that a digital signal through the high gain mode is not matched a digital signal through the low gain mode, where the mismatch may cause serious signal distortion. It is noted that the amplitude-phase-recording module 53 may be implemented by software, hardware or a combination of software and hardware.

In an example, it is assumed that, when the reference signal is processed by the high gain mode, the amplitude of the reference signal is amplified 100 times and the phase is reduced by 50 degrees; and when the reference signal is processed by the low gain mode, the amplitude of the second signal is amplified 10 times and the phase is reduced by 40 degrees. As can be seen, the amplifying factor of the first amplitude scaling factor is 100, the first phase deviation value is 50, the amplifying factor of the second amplitude scaling factor is 10, and the second phase deviation value is 40. In the high gain mode, the amplitude attenuating factor for the amplitude-phase-processing circuit 16 is 100, and the phase compensation value of the digital signal for the amplitude-phase-processing circuit 16 is 50; and in the low gain mode, the amplitude attenuating factor for the amplitude-phase-processing circuit 16 is 10, the phase compensation value of the digital signal for the amplitude-phase-processing circuit 16 is 40. Alternatively, in the high gain mode, the amplitude attenuating factor for the amplitude-phase-processing circuit 16 is 10, and the phase compensation value of the digital signal for the amplitude-phase-processing circuit 16 is 10; in the low gain mode, the amplitude attenuating factor for the amplitude-phase-processing circuit 16 is 0, the phase compensation value of the digital signal for the amplitude-phase-processing circuit 16 is 0, and so on.

The controller 12 of the receiver 40 as shown in FIG. 4 is similar to the controller 12 as shown in FIG. 1. In another example, the receiver 40 includes a controller similar to the controller 17 as shown in FIG. 2.

Figure 5:
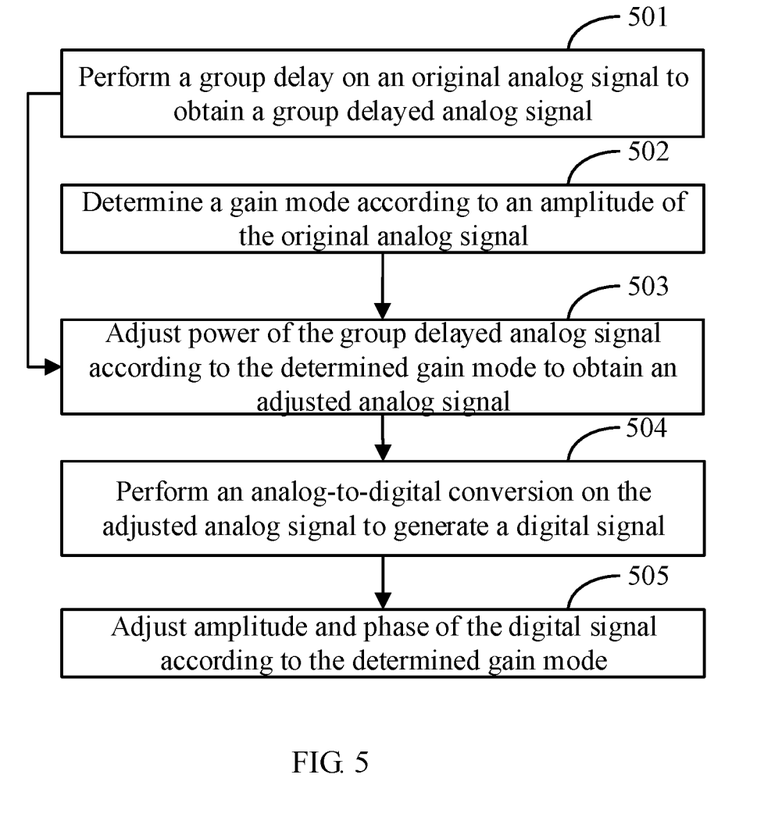
FIG. 5 is a flowchart illustrating a process of a method of receiving a signal according to an example of the present disclosure.

FIG. 5 is a flowchart illustrating a process of a method of receiving a signal according to an example of the present disclosure. The method of receiving the signal may be applied to any one of the receivers as shown in FIG. 1, FIG. 2 and/or FIG. 4, but it is not limited thereto. The method of receiving the signal may also be applied to other receivers and devices. The process of the method of receiving the signal may include steps 501-505.

At step 501, a group delay is performed on an original analog signal to obtain a group delayed analog signal.

In an example, compared with the original analog signal, the group delayed analog signal is delayed in a time domain, and other information of the group delayed analog signal is substantially the same as that of the original analog signal. In some cases, the group delay is performed on the original analog signal for a delay time. The delay time is determined which is greater than a sum of a first time for determining the gain mode and a second time for switching a current gain mode to the determined gain mode.

At step 502, a gain mode is determined according to an amplitude of the original analog signal.

In some cases, a gain mode is determined according to the amplitude of the original analog signal. For example, the low-gain mode is used to adjust, such as amplify or attenuate power of the group delayed analog signal with a relatively large amplitude, and the high-gain mode is used to adjust power of the group delayed analog signal with a relatively small amplitude, so as to reduce the dynamic range of the amplitude of the group delayed analog signal.

At step 503, power of the group delayed analog signal is adjusted according to the determined gain mode to obtain an adjusted analog signal.

In an example, the group delayed analog signal obtained by step 501 is adjusted with the determined gain mode according to the amplitude of the original analog signal in step 502.

At step 504, an analog-to-digital conversion is performed on the adjusted analog signal to generate a digital signal.

In some cases, the analog-to-digital conversion is performed on the adjusted analog signal to generate the digital signal.

At step 505, amplitude and phase of the digital signal are adjusted according to the determined gain mode.

When the determined gain mode in step 502 is a high gain mode, the amplitude of the digital signal is adjusted according to an amplitude scaling factor corresponding to the high gain mode, and the phase of the digital signal is compensated according to a phase compensation value corresponding to the high gain mode. When the determined gain mode in step 502 is a low gain mode, the amplitude of the digital signal is adjusted according to an amplitude scaling factor corresponding to the low gain mode, and the phase of the digital signal is compensated according to a phase compensation value corresponding to the low gain mode.

The order of execution of the respective steps in the method of receiving the signal shown in FIG. 5 is not limited to the examples shown in FIG. 5. In some cases, there may be other steps before, after, or in between the respective steps in the method of receiving the signal.

Figure 6:
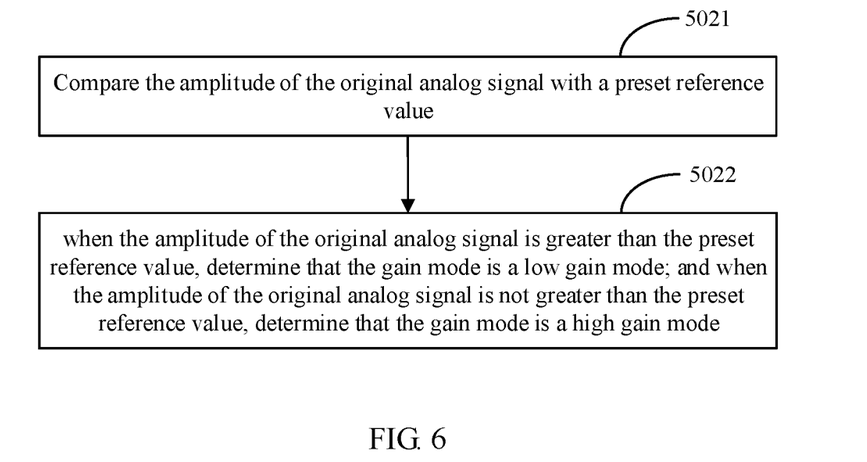
FIG. 6 is a flowchart illustrating step 502 included in FIG. 5 according to an example of the present disclosure.

FIG. 6 is a flowchart illustrating step 502 included in FIG. 5 according to an example of the present disclosure. The step 502 may include sub-steps 5021-5022.

At sub-step 5021, the amplitude of the original analog signal is compared with a preset reference value.

At sub-step 5022, when the amplitude of the original analog signal is greater than the preset reference value, it is determined that the gain mode is a low gain mode; and when the amplitude of the original analog signal is not greater than the preset reference value, it is determined that the gain mode is a high gain mode.

Figure 7:
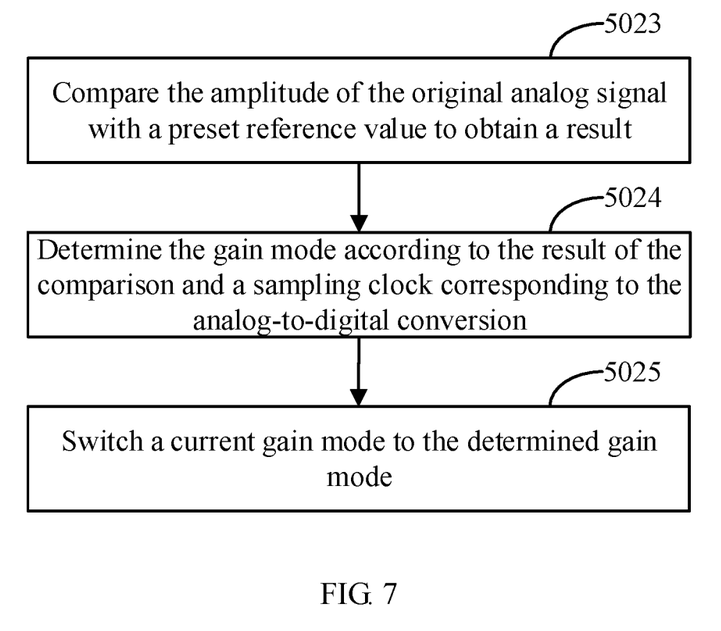
FIG. 7 is a flowchart illustrating step 502 included in FIG. 5 according to another example of the present disclosure.

FIG. 7 is a flowchart illustrating step 502 included in FIG. 5 according to another example of the present disclosure. The step 502 may include sub-steps 5023-5025.

At sub-step 5023, the amplitude of the original analog signal is compared with a preset reference value to obtain a result. The preset reference value may be set according to a maximum amplitude of an analog signal received by the receiver 10 and respective gain modes.

At sub-step 5024, the gain mode is determined according to the result of the comparison and a sampling clock corresponding to the analog-to-digital conversion.

In some cases, when to determine the gain mode may be determined based on a sampling clock corresponding to the analog-to-digital conversion. In an example, when a first result indicating that the amplitude of the original analog signal is greater than the reference value is obtained, it is determined that the gain mode is the low gain mode according to the sampling clock corresponding to the analog-to-digital conversion. When a second result indicating that the amplitude of the original analog signal is not greater than the reference value is obtained, it is determined that the gain mode is the high gain mode according to the sampling clock corresponding to the analog-to-digital conversion.

At sub-step 5025, a current gain mode is switched to the determined gain mode.

When the gain mode is determined, the current gain mode may be directly switched to the determined gain mode. In some cases, the current gain mode starts to be switched at a start moment of a sampling cycle of the sampling clock.

The step 502 as shown in FIGS. 6 and 7 are illustrated in a form of modules, and the order of the modules as shown in FIGS. 6 and 7 and the division of the actions in the respective modules are not limited to the illustrated examples. For example, the respective modules can be executed in different orders; an action in one module can be combined with an action in another module or split into multiple actions. In some cases, there may be other sub-steps before, after, or in between the sub-steps of the step 502.

In an example, the method further includes: detecting whether or not the analog-to-digital conversion is completed; and when it is detected that the analog-to-digital conversion is completed, the amplitude and the phase of the digital signal start to be adjusted according to the gain mode.

In some cases, a respective amplitude scaling factor and a respective phase compensation value of the digital signal under each of gain modes are determined. The gain modes include a high gain mode and a low gain mode. It is noted that an amplifying factor of the low gain mode is less than that of the high gain mode, and an attenuating factor of the low gain mode is higher than that of the high gain mode.

To determine the amplitude scaling factor and the phase compensation value of the digital signal under each of the gain modes, a reference signal of which a frequency is the same as that of the analog signal are generated. The reference signal is output to the high gain mode to obtain a first signal. The reference signal is output to the low gain mode to obtain a second signal. Under the high gain mode, a first amplitude scaling factor and a first phase deviation value of the first signal are obtained. Under the low gain mode, a second amplitude scaling factor and a second phase deviation value of the second signal are obtained. Based on the first amplitude scaling factor, the second amplitude scaling factor, the first phase deviation value and the second phase deviation value, the amplitude scaling factor and the phase compensation value of the digital signal under respective gain modes can be determined.

The implementation of various steps in the foregoing method of receiving the signal may refer to the implementation of configurations and functions of the corresponding circuit or module in the above receivers, and further detail is omitted for brevity.

Embodiments of the subject matter and the functional operations described in the present disclosure can be implemented in digital electronic circuitry, in tangibly-embodied computer software or firmware, in computer hardware, including the structures disclosed in the present disclosure and their structural equivalents, or in combinations of one or more of them. Embodiments of the subject matter described in the present disclosure can be implemented as one or more computer programs, i.e., one or more modules of computer program instructions encoded on a tangible non-transitory program carrier for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. The computer storage medium can be a machine-readable storage device, a machine-readable storage substrate, a random or serial access memory device, or a combination of one or more of them.

The processes and logic flows described in the present disclosure can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Computers suitable for the execution of a computer program include, by way of example, can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name a few.

Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

The above description is merely a part of examples of the present disclosure and is not intended to limit the present disclosure in any form. Therefore, without departing from the scope of the technical scheme of the present disclosure, based on technical essences of the present disclosure, any simple alterations, equal changes and modifications should fall within the protection scope of the technical scheme of the present disclosure.

What is claimed is:

1. A receiver comprising:
   a group delay circuit configured to perform a group delay on an original analog signal for a delay time to obtain a group delayed analog signal;
   a controller configured to determine a gain mode according to an amplitude of the original analog signal;
   a gain circuit coupled to the group delay circuit and the controller and configured to adjust, according to the determined gain mode, a power of the group delayed analog signal to obtain an adjusted analog signal, wherein the delay time is greater than a sum of a first time for the controller determining the gain mode and a second time for the gain circuit to switch a current gain mode to the determined gain mode;
   an analog-to-digital (ADC) converter coupled to the gain circuit and configured to perform an analog-to-digital conversion on the adjusted analog signal to generate a digital signal; and
   an amplitude-phase-processing circuit coupled to the analog-to-digital converter and configured to adjust amplitude and phase of the digital signal according to the determined gain mode.

2. The receiver of claim 1, wherein the controller comprises:
   a comparing module configured to obtain a result by comparing the amplitude of the original analog signal with a preset reference value; and
   a gain controller configured to:
      determine that the gain mode is a low gain mode when the result indicates that the amplitude of the original analog signal is greater than the preset reference value; and
      determine that the gain mode is a high gain mode when the result indicates that the amplitude of the original analog signal is not greater than the preset reference value.

3. The receiver of claim 2, wherein the controller further comprises:
   a time-sequence control module configured to, according to a sampling clock of the analog-to-digital converter, trigger the gain controller to determine the gain mode based on the result from the comparing module.

4. The receiver of claim 3, wherein the time-sequence control module is further configured to:
  detect whether the analog-to-digital converter finishes the analog-to-digital conversion; and
  in response to detecting that the analog-to-digital converter finishes the analog-to-digital conversion, trigger the amplitude-phase-processing circuit to adjust the amplitude and the phase of the digital signal according to the gain mode.

5. The receiver of claim 1, wherein the gain circuit is configured to switch from a current gain mode to the determined gain mode to amplify or attenuate the power of the group delayed analog signal.

6. The receiver of claim 1, wherein the receiver further comprises:
  an amplitude-phase-calibrating circuit configured to determine an amplitude scaling factor and a phase compensation value of the digital signal for the amplitude-phase-processing circuit based on the determined gain mode.

7. The receiver of claim 6, wherein the amplitude-phase-calibrating circuit comprises:
  a signal generating circuit configured to:
    generate a reference signal of which a frequency is same as that of the original analog signal,
    output the reference signal to the gain circuit under a high gain mode to obtain a first signal, and
    output the reference signal to the gain circuit under a low gain mode to obtain a second signal;
  an amplitude-phase-detecting circuit coupled to the gain circuit and configured to:
    detect a first amplitude scaling factor and a first phase deviation value of the first signal with respect to the reference signal, and
    detect a second amplitude scaling factor and a second phase deviation value of the second signal with respect to the reference signal; and
  an amplitude-phase-recording module configured to
    record the first amplitude scaling factor and the first phase deviation value associated with the high gain mode, and
    record the second amplitude scaling factor and the second phase deviation value associated with the low gain mode, and
  wherein the amplitude-phase-calibrating circuit is configured to determine the amplitude scaling factor and the phase compensation value of the digital signal based on the determined gain mode, the first amplitude scaling factor and the first phase deviation value associated with the high gain mode, and the second amplitude scaling factor and the second phase deviation value associated with the low gain mode.

8. The receiver of claim 1, wherein the amplitude-phase-processing circuit is configured to:
  adjust the amplitude of the digital signal according to an amplitude scaling factor corresponding to the determined gain mode, and
  compensate the phase of the digital signal according to a phase compensation value corresponding to the determined gain mode.

9. The receiver of claim 1, wherein the gain mode comprises one of
  a high gain mode, and
  a low gain mode,
  wherein an amplifying factor of the low gain mode is smaller than an amplifying factor of the high gain mode, and an attenuating factor of the low gain mode is higher than an attenuating factor of the high gain mode.

10. A method of receiving a signal, comprising:
  performing a group delay on an original analog signal to obtain a group delayed analog signal;
  determining a gain mode according to an amplitude of the original analog signal;
  adjusting, according to the determined gain mode, a power of the group delayed analog signal to obtain an adjusted analog signal;
  performing an analog-to-digital conversion on the adjusted analog signal to generate a digital signal; and
  adjusting amplitude and phase of the digital signal according to the determined gain mode,
  wherein performing the group delay on the analog signal comprises:
    determining that a delay time is greater than a sum of a first time for determining the gain mode and a second time for switching a current gain mode to the determined gain mode; and
    performing the group delay on the analog signal for the delay time.

11. The method of claim 10, wherein determining the gain mode according to the amplitude of the original analog signal comprises:
  comparing the amplitude of the original analog signal with a preset reference value to obtain a result; and
  determining the gain mode to be one of a low gain mode and a high gain mode by determining whether the result indicates that the amplitude of the analog signal is greater than the preset reference value or not.

12. The method of claim 11, wherein determining the gain mode according to the amplitude of the original analog signal further comprises:
  determining when to determine the gain mode based on a sampling clock corresponding to the analog-to-digital conversion.

13. The method of claim 12, further comprising:
  starting to switch a current gain mode at a start moment of a sampling cycle of the sampling clock.

14. The method of claim 10, further comprising:
  detecting whether the analog-to-digital conversion is completed; and
  in response to detecting that the analog-to-digital conversion is completed, starting to adjust the amplitude and the phase of the digital signal according to the determined gain mode.

15. The method of claim 10, further comprising:
  determining an amplitude scaling factor and a phase compensation value of the digital signal based on the determined gain mode.

16. The method of claim 15, wherein determining the amplitude scaling factor and the phase compensation value of the digital signal comprises:
  generating a reference signal of which a frequency is same as that of the original analog signal;
  obtaining a first signal by processing the reference signal under a high gain mode;
  obtaining a second signal by processing the reference signal under a low gain mode;
  determining a first amplitude scaling factor and a first phase deviation value of the first signal with respect to the reference signal;
  determining a second amplitude scaling factor and a second phase deviation value of the second signal with respect to the reference signal;

determining the amplitude scaling factor based on the determined gain mode, the first amplitude scaling factor under the high gain mode and the second amplitude scaling factor under the low gain mode; and determining the phase compensation value under the respective gain modes based on the determined gain mode, the first phase deviation value under the high gain mode and the second phase deviation value under the low gain mode.

17. The method of claim 16, wherein an amplifying factor of the low gain mode is smaller than an amplifying factor of the high gain mode, and an attenuating factor of the low gain mode is higher than an attenuating factor of the high gain mode.

18. The method of claim 10, wherein adjusting the amplitude and the phase of the digital signal according to the determined gain mode comprises:

adjusting the amplitude of the digital signal according to an amplitude scaling factor corresponding to the determined gain mode, and compensating the phase of the digital signal according to a phase compensation value corresponding to the determined gain mode.

19. A receiver comprising:

a group delay circuit configured to perform a group delay on an original analog signal to obtain a group delayed analog signal;

a controller configured to determine a gain mode according to an amplitude of the original analog signal, wherein the gain mode comprises one of a high gain mode and a low gain mode, wherein an amplifying factor of the low gain mode is smaller than an amplifying factor of the high gain mode, and an attenuating factor of the low gain mode is higher than an attenuating factor of the high gain mode;

a gain circuit coupled to the group delay circuit and the controller and configured to adjust, according to the determined gain mode, a power of the group delayed analog signal to obtain an adjusted analog signal;

an analog-to-digital (ADC) converter coupled to the gain circuit and configured to perform an analog-to-digital conversion on the adjusted analog signal to generate a digital signal; and an amplitude-phase-processing circuit coupled to the analog-to-digital converter and configured to adjust amplitude and phase of the digital signal according to the determined gain mode.

* * * * *